United States Patent [19]
Gao et al.

[11] Patent Number: 5,447,577
[45] Date of Patent: Sep. 5, 1995

[54] CARBON DIOXIDE-BASED FLUXING MEDIA FOR NON-VOC, NO-CLEAN SOLDERING

[75] Inventors: Guilian Gao, Novi; Lakhi N. Goenka, Ann Arbor, both of Mich.

[73] Assignee: Ford Motor Company, Dearborn, Mich.

[21] Appl. No.: 327,938

[22] Filed: Oct. 24, 1994

[51] Int. Cl.$^6$ ............................................. B23K 35/34
[52] U.S. Cl. ............................................. 148/23; 148/24; 148/25; 228/223
[58] Field of Search ............................................. 148/23–25; 228/223

[56] References Cited

U.S. PATENT DOCUMENTS

| | | | |
|---|---|---|---|
| 3,235,414 | 2/1966 | Marks | 148/23 |
| 3,275,201 | 9/1966 | Tedeschi et al. | 222/402.25 |
| 4,566,916 | 1/1986 | Nagano et al. | 148/26 |
| 5,013,366 | 5/1991 | Jackson et al. | 134/1 |
| 5,092,943 | 3/1992 | Davis | 148/23 |
| 5,288,332 | 2/1994 | Pustilnik et al. | 134/27 |

OTHER PUBLICATIONS

"Ternary Systems Of Liquid Carbon Dioxide", by Alfred W. Francis, Journal of Physical Chemistry, Jun. 1, 1954, pp. 1099–1100.
"Supercritical Fluids for Single Wafer Cleaning", by Edward Bok et al., Soli State Technology, Jun., 1992, 117–120.
"Supercritical Carbon Dioxide Precision Cleaning For Solvent And Waste Reduction", by W. Dale Spall, International Journal of Environmentally Conscious Design & Manufacturing, vol. 2, No. 1, pp. 81–86, 1993.

*Primary Examiner*—Peter D. Rosenberg
*Attorney, Agent, or Firm*—Roger L. May; Joseph W. Malleck

[57] ABSTRACT

A flux formulation for use in the assembly of electronic circuit boards having components to be joined by soldering. The formulation comprises a medium which acts as a carrier and solvent for the fluxing agent, which includes in a preferred embodiment supercritical carbon dioxide. The formulation also includes a fluxing agent, being at least partially soluble in the supercritical carbon dioxide which serves to transport the fluxing agent before deposition thereof upon a soldering site. The supercritical fluid is delivered through a nozzle to the circuit board, the supercritical condition being maintained until the supercritical fluid is discharged from the nozzle. The fluxing agent at least partially loses its solubility in the fluid thereupon and is transported to the board by a stream of carbon dioxide gas. Also disclosed is a method for delivering a flux formulation to the electronic circuit board.

18 Claims, 1 Drawing Sheet

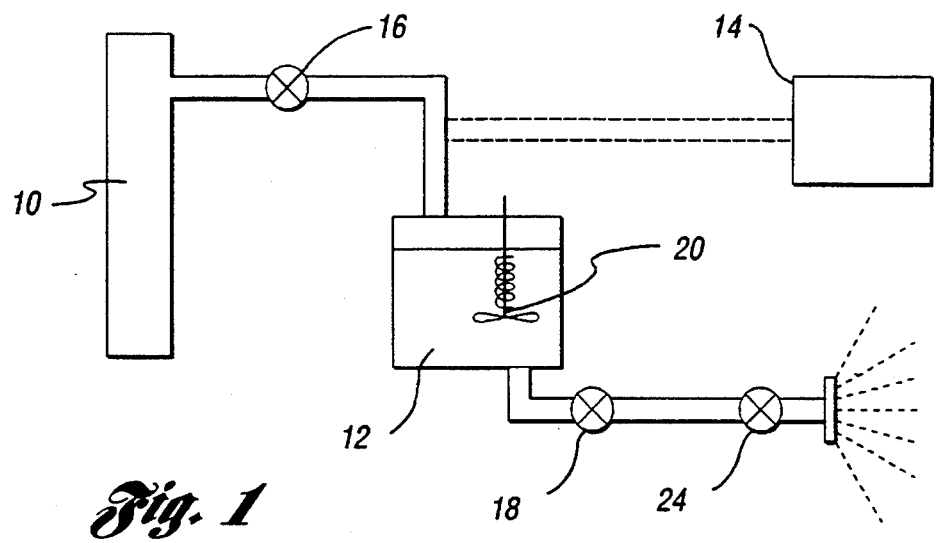

*Fig. 1*

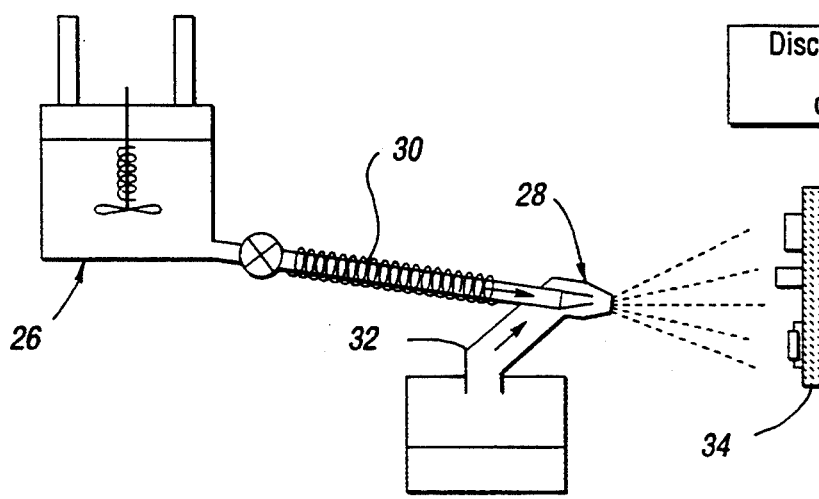

```
Add fluxing agent and optional
co-solvent into a mixing vessel
           ↓
Introduce supercritical CO2
as a solvent and carrier
           ↓
Pressurize to achieve super-
critical state and stir and mix
           ↓
Discharge the flux through
a nozzle as finely
dispersed particles
```

*Fig. 4*

```
Flux Solution      Deliver low pressure CO2
        ↓                    ↓
         Mix inside a spray nozzle
                    ↓
         Spray flux as finely
            dispersed mist
```

CARBON DIOXIDE-BASED FLUXING MEDIA FOR NON-VOC, NO-CLEAN SOLDERING

TECHNICAL FIELD

This invention relates to fluxing media employing carbon dioxide ($CO_2$) for non-VOC, no-clean soldering operations.

BACKGROUND ART

There are two types of widely used fluxing technology in the electronics industry: liquid spray and liquid foaming. For both techniques, to achieve a uniform deposition, the solvent in the flux must wet the electronic board to be soldered to form a continuous film. Conventionally, the volume of the solvent needed to wet a board is relatively large. But for a soldering operation having no post-soldering cleaning steps, the flux residue after the soldering must be benign and minimum in quantity. Accordingly, most no-clean fluxes usually have very high solvent content (95% to 99%) and low solid content (typically 1% to 5%).

There are basically two types of solvents in use today: volatile organic compounds (VOC) which evaporate easily during the soldering process, and water. Low solid content fluxes using alcohol or other organic compounds as solvents wet the board easily. However, they emit large amounts of VOC during the soldering process and thus create environmental problems. Low solid content water-based fluxes, on the other hand, need a surfactant to assist wetting, since water has a very high surface tension when deployed upon the electronic board and metals to be joined. The surfactant leaves a hygroscopic residue after the soldering operation and thus has to be cleaned off or the final product has to be protected with a conformal coating or an encapsulant.

The quest for better ways to clean precision electronic components without ozone-depleting solvents had led to the development of cleaning processes that reduce the need for solvents. Techniques have now emerged for using supercritical carbon dioxide instead of environmentally harmful CFC-based solvents to remove particles and organic contaminants introduced during the manufacturing of circuit boards. However, the use of a supercritical carbide dioxide may tend to adversely attack the board itself or a plastic housing which may accommodate the board. Accordingly, for these among other reasons, supercritical carbon dioxide may be a sub-optical approach to cleaning electronic circuit boards. Carbon dioxide becomes supercritical— that is, it remains as a gas but has the properties of liquid organic solvents—at relatively low pressures and temperatures. When heated to 31° C. and 73 bars (1050 psi), carbon dioxide is in a supercritical state and possesses the properties of a liquid solvent. In a supercritical state, it is highly diffusive and its low surface tension allows it to penetrate into small spaces to dissolve residues completely from the complex surfaces of manufactured parts. Supercritical carbon dioxide is nontoxic and nonflammable.

U.S. Pat. No. 5,013,366 discloses supercritical $CO_2$ as a solvent to clean organic contaminants, including soldering flux residue. U.S. Pat. No. 5,288,332 discloses $CO_2$ dissolved in water to remove metal contamination. U.S. Pat. No. 4,566,916 discloses $CO_2$ produced through decomposition of $CaCO_3$ during the welding operation to dilute $H_2$, $N_2$ and $O_2$ partial pressure during welding. U.S. Pat. No. 3,275,201 discloses $CO_2$ being used as a propellant for a pressurized flux package. However, that disclosure teaches operation at low pressures (15 to 40 psi), which is much lower than a supercritical pressure (1050 psi). At this pressure range, $CO_2$ cannot be used as a solvent for a flux.

SUMMARY OF INVENTION

The invention relates to a flux formulation for the use in the assembly of electronic circuit boards. The formulation comprises supercritical carbon dioxide which serves as a carrier for a fluxing agent which is at least partially soluble in the supercritical carbon dioxide. The supercritical carbon dioxide serves as a carrier for depositing the fluxing agent upon a soldering site.

The invention also comprises a method for delivering a flux formulation to an electronic circuit board having components to be joined by soldering.

The method comprises:

adding a fluxing agent into a mixing vessel;

introducing gaseous carbon dioxide into the mixing vessel, the carbon dioxide and the fluxing agent becoming intermixed and dissolved to form a fluid;

heating the mixing vessel to a temperature greater than 30 degrees Centigrade and pressurizing it to a pressure above 1050 psi to form a supercritical fluid;

delivering the supercritical fluid through a spray nozzle to the circuit board, the supercritical condition being maintained until the supercritical fluid is discharged from the spray nozzle at a reduced pressure, the fluxing agent at least partially losing its solubility thereupon and being transported to the board as a finely dispersed spray by a stream of carbon dioxide gas.

In an alternative approach disclosed by the present invention, there is a method for delivering a flux formulation to an electronic circuit board comprising the steps of:

heating a fluxing agent and water to form a diluted fluxing agent in a closed supply vessel to minimize water loss by evaporation;

providing carbon dioxide in a low pressure state;

delivering the diluted fluxing agent through a heated conduit to a spray nozzle so that flux temperature is preserved;

communicating the carbon dioxide as a stream separate from the diluted fluxing agent to the spray nozzle so that mixing of the carbon dioxide and the diluted fluxing agent is achieved substantially within the spray nozzle to form a fluxing mixture; and directing a finely dispersed spray of the fluxing mixture onto the circuit board.

BRIEF DESCRIPTION OF THE DRAWINGS

FIG. 1 is an equipment schematic of the apparatus of the present invention;

FIG. 2 is a process flow diagram illustrating the main method steps of the present invention;

FIG. 3 is an alternate equipment schematic of the present invention; and

FIG. 4 is an alternate process flow diagram illustrating the main method steps of the present invention.

BEST MODE(S) FOR CARRYING OUT THE INVENTION

The invention broadly relates to a flux formulation for use in the assembly of electronic circuit boards. The formulation includes supercritical carbon dioxide and a fluxing agent. The fluxing agent is at least partially soluble in the supercritical carbon dioxide which serves as a carrier for depositing the fluxing agent upon a soldering site.

The method of the present invention calls for delivering a flux formulation to an electronic circuit board having components to be joined by soldering. The method includes the following steps:

- adding a solid or liquid fluxing agent into a mixing vessel;
- introducing gaseous carbon dioxide into the mixing vessel, the carbon dioxide and the fluxing agent becoming intermixed and dissolved to form a fluid;
- heating the mixing vessel to a temperature greater than 30 degrees Centigrade and pressurizing it to a pressure above 1050 psi to form a supercritical fluid;
- delivering the supercritical fluid through a spray nozzle to the circuit board, the supercritical condition being maintained until the supercritical fluid is discharged from the spray nozzle at a reduced pressure, the fluxing agent at least partially losing its solubility thereupon and being transported to the board as a finely dispersed spray by a stream of carbon dioxide gas.

The flux formulation is provided by dissolving a fluxing agent such as adipic acid or its equivalents in supercritical $CO_2$ fluid. In the supercritical region, materials which are not soluble in $CO_2$ gas, such as adipic acid, become soluble in the fluid. By controlling the temperature and pressure of the $CO_2$, the supercritical condition is maintained until the flux is discharged through the spray nozzle. Once discharged, the pressure of the flux drops to atmospheric pressure. At this stage, the adipic acid is no longer soluble in the $CO_2$ gas. Instead, it is carried to the electronic board to be soldered in the form of a fine powder by the $CO_2$ gas stream. Environmental benefits flow from the fact that $CO_2$ is not considered a VOC and thus is not regulated.

Although adipic acid is the preferred fluxing agent for this invention, any other fluxing agent which is soluble in supercritical $CO_2$, such as other weak organic acids and rosin, can be used.

An organic or aqueous co-solvent which has high solubility for the fluxing agent and is fully miscible with $CO_2$ can be added in a small quantity to enhance the solubility of the fluxing agent as well as to enhance flux deposition after discharge. Solvents suitable as a co-solvent include methanol, ethanol, acetone, and water.

Use of supercritical $CO_2$ to dissolve organic matter to advantage to deposit flux for electronic soldering is not taught or suggested in the known art. This property of supercritical $CO_2$ fluid has been widely explored for cleaning of organic contaminations and flux residues. However, it has never before been used as a solvent-carrier to deposit soldering flux.

In an alternative approach, the method of dispensing the flux calls for $CO_2$ gas to be used at a low pressure (up to 100 psi) as a carrier for the flux. Other gases, such as air or nitrogen, may be used. By lowering the pressure, $CO_2$ loses its property of dissolving organic matter and therefore can no longer serve as a solvent for the flux.

The preferred flux is a water solution of adipic acid with very high solid content (up to 62.5%) contained in a closed vessel, heated to near the boiling point of water (i.e., 100° C.).

Using a separate stream of gas carrier to dispense the flux provides distinct advantages over fluxing technologies currently used in the electronics industry because the separate stream can handle fluxes with a very high solid content, yet still provide a uniform deposition. As a result, this approach requires only a small fraction of the solvent used in today's low solid fluxes to achieve a uniform deposition. This overcomes some problems associated with use of a solvent in conventional fluxes.

The method of this invention disperses the flux into very fine particles. Thus, it is not necessary for the solvent to wet the board completely in order to achieve a uniform flux deposition. Therefore, for fluxes using a VOC as a solvent, the volume of VOC emitted during soldering operations can be greatly reduced. For a water-based flux, it can eliminate the need for a surfactant which leaves hygroscopic residue, and thus eliminates post-soldering cleaning or the need for a conformal coating or an encapsulant.

Heating the water-based flux dramatically increases the solubility of adipic acid in water. At 25° C., 100 ml of water dissolves 1.44 g adipic acid, while 100 ml of boiling water dissolves 160 g. Water-based low solid fluxes formulated to be applied through spray or forming using today's fluxing technology typically contain less than 5% solid. Through heating, flux containing as much as 62.5% activator can be achieved.

FIGS. 1 and 2 respectively are schematics of the apparatus and process flow chart of this invention. In FIG. 1, a $CO_2$ supply tank 10 is used to fill the mixing vessel 12. A flux activator, or other fluxing agent such as rosin, and a co-solvent (if desired) are placed inside the mixing vessel 12 prior to introduction of the $CO_2$. A vacuum displacement pump 14 can be optionally included in the process to increase pressure of the $CO_2$ in the mixing vessel 12 during filling. Once the mixing vessel 12 is filled, the two valves 16, 18 at the inlet and the discharge are closed. The mixing vessel 12 is then heated to above 31° C. and pressure is raised at or about 1050 psi (critical point for $CO_2$) to achieve a supercritical state. A stirrer 20 inside the vessel 12 agitates the flux to facilitate mixing and dissolution. The flux is then discharged through a spray nozzle 22 connected to a metering discharge valve 24. The flux may contain 1% to 5% adipic acid and up to 5% co-solvent such as ethanol.

FIGS. 3 and 4 are the schematic and process flow charts of an alternate embodiment of the invention. In FIG. 3, the flux formulation supply tank 26 is heated to near 100° C. for fluxes with 62.5% solid content. A lower temperature can be used if a lower solid content is desired. A closed tank is used to prevent solvent loss. The flux is introduced into the atomizing nozzle 28 through a heated or insulated pipe 30, which is heated to maintain flux temperature. Low pressure $CO_2$ (20 to 100 psi pressure) is introduced into the atomizing nozzle as a separate stream via conduit 32. The atomizing nozzle 28 mixes the two streams and discharges the flux as finely dispersed particles.

By adjusting the ratio of the two streams and the rate of spray, the rate of flux consumption can be controlled with precision. The flux can contain 1% to 62.5% adipic acid and 99% to 37.5% water.

To minimize ionic contamination of the board, the diluent water should be deionized or distilled. Addition of a biocide is not necessary because the temperature of the flux during the operation is high enough to kill most bacteria.

In each embodiment, the electronic board travels through the dispersed flux stream and the flux is thus deposited onto the board uniformly.

The apparatus of the present invention (FIG. 1) includes a carbon dioxide supply tank 10 with a pressure regulator and relief valves (not shown) as appropriate to discharge carbon dioxide from the supply tank at about 800–1200 psi. Thus, carbon dioxide enters the mixing vessel 12 at 800–1200 psi. In one experiment, the capacity of the mixing vessel is about 1–5 liters. It has a removable cover having a diameter of about 2–4 inches. Also provided within the mixing vessel is a means for stirring. A heater is also suitably positioned within the mixing vessel which may raise the inside temperature up to 200° C. A temperature monitor and controller are also provided.

A pressurizing means 14, such as a vacuum displacement pump, is provided whereby the pressure inside the mixing vessel may be raised up to 2000 psi. A pressure gauge is also provided. Relief valves are deployed as appropriate. An inlet port is provided on the top of the mixing vessel. A discharge port is provided adjacent its lower extremities.

The metering valve 24 at the discharge port of the mixing vessel serves to reduce pressure to atmospheric pressure. A fine control is provided by which exit flow is regulated to a speed of about 1–10 meters per second. Also deployed is a flow meter. Connected to the valve is a flexible tube having a diameter of about 0.5 inches. Its length is about 12 inches.

The apparatus used in experimental approaches thus far is available from such sources as Autoclave Engineers in Erie Pa.

In the alternative approach disclosed herein, a flux supply tank can be made from any type of materials which are reasonably resistant to acidic corrosion. Suitable materials include a stainless steel tank. The atomizing nozzle has one orifice for introducing the liquid flux. The amount of flux sprayed and the spray angle can be controlled by controlling the velocity of the carrier gas. A suitable atomizing nozzle is available from Spraying Systems Corporation located in Wheaton, Ill.

Thus, the invention includes (1) in the preferred approach, the use of supercritical $CO_2$ as a solvent for the fluxing agent gas stream that carries or transports the fluxing agent to a soldering site, thereby greatly enhancing dispersion of the flux and thus reducing the volume of co-solvents needed for the flux, (2) in both the preferred and alternate approaches, the use of $CO_2$ gas in conjunction with water, which eliminates electric static discharge (ESD) during spraying, and (3) in both the preferred and alternate approaches, heating the flux, which dramatically increases its dissolved solid content.

What is claimed is:

1. A flux formulation for use in the assembly of electronic circuit boards, the formulation comprising:
   a medium which acts as a carrier and as a solvent, the medium including supercritical carbon dioxide; and
   a fluxing agent, the fluxing agent being at least partially soluble in the supercritical carbon dioxide which serves to transport the fluxing agent before deposition thereof upon a soldering site.

2. The flux formulation of claim 1, wherein the fluxing agent comprises adipic acid.

3. The flux formulation of claim 1, wherein the fluxing agent comprises one or more weak organic acids.

4. The flux formulation of claim 1, wherein the fluxing agent comprises a rosin.

5. The flux formulation of claim 1, further comprising:
   a co-solvent having a high solubility for the fluxing agent and being miscible with carbon dioxide, the co-solvent being added to enhance the solubility of the fluxing agent and facilitating flux deposition after discharge.

6. The flux formulation of claim 5, wherein the co-solvent includes a material selected from the group consisting of methanol, ethanol, acetone, water, and mixtures thereof.

7. The flux formulation of claim 1, wherein the fluxing agent is a water solution of adipic acid with a solid content of up to 62.5%.

8. A flux formulation for use in the assembly of electronic circuit boards, the formulation comprising:
   a carrier, the carrier including carbon dioxide; and
   a flux solution comprising a fluxing agent and a solvent, the flux solution serving to transport the fluxing agent before deposition thereof upon a soldering site.

9. A method for delivering a flux formulation to an electronic circuit board having components to be joined by soldering, comprising:
   adding a fluxing agent into a mixing vessel;
   introducing carbon dioxide into the mixing vessel, the carbon dioxide and the fluxing agent becoming intermixed and dissolved to form a fluid;
   heating the mixing vessel and the fluid to a temperature greater than 30 degrees Centigrade and pressurizing it to a pressure above 1050 psi to form a supercritical fluid;
   delivering the supercritical fluid through a nozzle to the circuit board, a supercritical condition being maintained until the supercritical fluid is discharged from the nozzle, the fluxing agent at least partially losing its solubility in the supercritical fluid thereupon and being transported to the board by a stream of carbon dioxide gas.

10. The method of claim 9, further comprising:
    providing a means for pressurizing in communication with the mixing vessel to increase the partial pressure of the carbon dioxide therewithin during introduction thereof into the vessel.

11. The method of claim 9, further comprising a means for stirring disposed within the mixing vessel to facilitate mixing and dissolution of the fluxing agent within the carbon dioxide.

12. The method of claim 11, wherein the step of adding a fluxing agent comprises adding 1–5% adipic acid.

13. The method of claim 12, further comprising the step of adding up to 5% of a co-solvent.

14. The method of claim 13, wherein the co-solvent comprises a material selected from the group consisting of methanol, ethanol, acetone, water, and mixtures thereof.

15. A method for delivering a flux formulation to an electronic circuit board having components to be joined by soldering, comprising:

heating a fluxing agent and water to a temperature up to 100° C. to form a flux solution in a closed supply vessel to minimize water loss by evaporation;
providing carbon dioxide in a low pressure state;
delivering the flux solution through a conduit to a nozzle so that flux temperature is preserved;
communicating the carbon dioxide as a stream separate from the flux solution to the nozzle so that mixing is achieved substantially within the nozzle to form a fluxing mixture; and
spraying the fluxing mixture onto the circuit board.

16. The method of claim 15, wherein the step of providing carbon dioxide in a low pressure state comprises providing carbon dioxide at a pressure up to 100 psi.

17. The method of claim 15, further comprising providing means for adjusting the streams of carbon dioxide and the fluxing agent entering the nozzle so that the ratio of the streams, the rate of spray, and the rate of flux consumption can be controlled.

18. The method of claim 15, wherein the flux solution comprises 1–62.5% adipic acid and 99–37.5% water.

* * * * *